United States Patent
Zhao et al.

(10) Patent No.: US 7,821,808 B2
(45) Date of Patent: Oct. 26, 2010

(54) MULTILAYER FERROELECTRIC DATA STORAGE SYSTEM WITH REGENERATIVE READ

(75) Inventors: Tong Zhao, Cranberry Township, PA (US); Martin Gerard Forrester, Murrysville, PA (US); Florin Zavaliche, Cranberry Township, PA (US); Joachim Ahner, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 128 days.

(21) Appl. No.: 12/363,062

(22) Filed: Jan. 30, 2009

(65) Prior Publication Data

US 2010/0195369 A1    Aug. 5, 2010

(51) Int. Cl.
    *G11C 11/22*    (2006.01)
(52) U.S. Cl. .............. 365/145; 365/117; 365/173; 365/171; 257/295; 257/752
(58) Field of Classification Search ............... 365/145, 365/117, 171, 173; 257/295, 752
See application file for complete search history.

(56) References Cited

U.S. PATENT DOCUMENTS

| | | | | |
|---|---|---|---|---|
| 5,146,299 | A | * | 9/1992 | Lampe et al. ............... 257/295 |
| 5,343,421 | A | * | 8/1994 | Brennan ...................... 365/145 |
| 5,530,667 | A | * | 6/1996 | Omura et al. ............... 365/145 |
| 5,729,488 | A | * | 3/1998 | Drab et al. .................. 365/145 |
| 6,064,587 | A | | 5/2000 | Jo |
| 6,069,820 | A | * | 5/2000 | Inomata et al. ............. 365/171 |
| 6,151,240 | A | | 11/2000 | Suzuki |
| 6,344,991 | B1 | | 2/2002 | Mikami et al. |
| 6,498,362 | B1 | * | 12/2002 | Forbes et al. ............... 257/295 |
| 6,522,571 | B2 | | 2/2003 | Salling |
| 6,574,134 | B1 | | 6/2003 | Chen et al. |
| 6,580,632 | B2 | * | 6/2003 | Shimada et al. ............. 365/145 |
| 6,683,803 | B2 | * | 1/2004 | Gudesen et al. ............. 365/145 |
| 6,815,223 | B2 | * | 11/2004 | Celinska et al. ................ 438/3 |
| 6,952,362 | B2 | * | 10/2005 | Forbes ........................ 365/145 |
| 7,020,005 | B2 | * | 3/2006 | Karlsson et al. ............. 365/145 |
| 7,098,496 | B2 | | 8/2006 | Li et al. |

(Continued)

OTHER PUBLICATIONS

Wu, Jiagang et al., Double hysteresis loop in (Pb0.90La0.10)Ti0.975O3/Pb(Zr0.20Ti0.80)O3 bilayer thin films, Applied Physics Letters, 91, 212905, Nov. 21, 2007, pp. 1-3.

(Continued)

*Primary Examiner*—Viet Q Nguyen
(74) *Attorney, Agent, or Firm*—Kinney & Lange, P.A.

(57) ABSTRACT

A data storage system comprises first and second storage layers, a reader and a writer. The first storage layer has a first coercive potential and a first polarization. The second storage layer has a second coercive potential that is less than the first coercive potential, and a second polarization that is coupled to the first polarization. The writer performs a write operation in which a write potential is imposed across the first and second storage layers, such that the first coercive potential is exceeded across the first storage layer and the second coercive potential is exceeded across the second storage layer. The reader performs a read operation in which a read potential is imposed across the first and second storage layers, such that the second coercive potential is exceeded across the second storage layer and the first coercive potential is not exceeded across the first storage layer.

24 Claims, 6 Drawing Sheets

U.S. PATENT DOCUMENTS

| | | | |
|---|---|---|---|
| 7,291,878 | B2 | 11/2007 | Stipe |
| 7,391,706 | B2 | 6/2008 | Nauka et al. |
| 7,406,020 | B2 * | 7/2008 | Hong et al. ............ 369/126 |
| 2006/0023606 | A1 | 2/2006 | Lutwyche et al. |
| 2006/0239060 | A1 | 10/2006 | Shimada |
| 2010/0110754 | A1 * | 5/2010 | Hu et al. ............ 365/145 |

OTHER PUBLICATIONS

Misirlioglu, I.B. et al., Space charge contribution to the apparent enhancement of polarization in ferroelectric bilayers and multilayers, Applied Physics Letters, 91, 022911, Jul. 11, 2007, pp. 1-3.

Akcay, G. et al., Strain induced internal potentials of compositionally graded epitaxial ferroelectric thin films, Applied Physics Letters, 91, 021904, Jul. 3, 2007, pp. 1-3.

Ranjith, R. et al., Interfacial coupling and its size dependence in PbTiO3 and PbMg1/3Nb2/3)3 multilayers, Physical Review B, 74, 184104, Nov. 6, 2006, pp. 1-10.

Roytburd, A.L. et al., Dielectric anomaly due to electrostatic coupling in ferroelectric-paralectric bilayers and multilayers, Applied Physics Letters, 87, 092902, Aug. 22, 2005, pp. 1-3.

Wu, Yin-Zhong et al., Hysteresis loop of a ferroelectric bilayer with an antiferroelectric interfacial coupling, Journal of Applied Physics, vol. 91, No. 3, Feb. 1, 2002, pp. 1482-1486.

Chew, Khian-Hooi et al., Hysteresis loops of ferroelectric bilayers and superlattices, Applied Physics Letters, vol. 77, No. 17, Oct. 23, 2000, pp. 2755-2757.

* cited by examiner

MULTILAYER FERROELECTRIC DATA STORAGE SYSTEM WITH REGENERATIVE READ

BACKGROUND

This invention relates generally to ferroelectric materials, and specifically to ferroelectric systems for computing and data processing. In particular, the invention concerns a ferroelectric structure for use in non-volatile data storage systems and digital memory applications.

Non-volatile data systems span a range of different storage technologies, including disc drives, tape drives and other magnetic media-based systems. Non-volatile technologies are also used in flash drives and other addressable data storage arrays, including EEPROMs (electrically erasable programmable read-only memories) and other floating-gate transistor-based components. Ferroelectric materials in particular are utilized in a range of non-volatile random access memory (RAM) devices, including FRAM (or FeRAM) array-type components as well as probe-based devices utilizing a continuous ferroelectric medium.

In ferroelectric data storage systems, data are written by applying a write field (an electric field) to the ferroelectric material, such that the applied potential exceeds the ferroelectric coercive voltage. This causes the polarization to align along the write field direction. The polarization state is retained even after the write field is removed, making ferroelectric materials suitable for a range of non-volatile memory applications, as distinguished from standard volatile data systems such as DRAM (dynamic random access memory) and SRAM (static random access memory).

Transistor-based ferroelectric devices function similarly to flash memories, but have lower write field requirements and benefit from decreased power consumption and increased speed. Ferroelectric materials can also be used to manufacture continuous media, which function analogously to the magnetic media of traditional disc drives and tape-based data storage systems, but, depending upon material composition and manufacture, tend to have higher anisotropy energy and greater thermal stability, yielding high attainable storage densities with long data lifetimes.

Unfortunately, standard ferroelectric data storage systems require a destructive read cycle. In particular, ferroelectric memory is typically read out by generating a read voltage that exceeds the coercive voltage, in order to induce a switching signal when anti-aligned polarizations reorient along the read field. The switching signal (or lack thereof) defines a bit pattern, with "1" and "0" data states determined by the previously-written ferroelectric polarization, before the read potential was applied. At the end of the read cycle, however, each bit is oriented in the same direction as the read field; that is, the read process is destructive, such that the original data are erased, and will be lost unless a writeback loop or refreshing step is employed. As a result, there remains a continual need for improved ferroelectric data storage technologies, with particular respect to the problem of destructive data readback.

SUMMARY

This invention is directed to a data storage system using a multilayer ferroelectric stack, and a method of using the system to store data. The system comprises first and second ferroelectric layers, a reader and a writer. The first ferroelectric layer has a first coercive voltage and a first polarization. The second ferroelectric layer has a second coercive voltage that is less than the first coercive voltage, and a second polarization that is coupled to the first polarization. The coupling is either ferroelectric, which tends to align the two polarizations in the same direction, or anti-ferroelectric, which tends to align the two polarizations in opposite directions.

The reader and the writer are sometimes formed as a transducer with both read and write capability. The writer elements perform a write operation in which a write potential is imposed across the first and second ferroelectric layers. In the write operation, the first coercive voltage is exceeded across the first ferroelectric layer and the second coercive voltage is exceeded across the second ferroelectric layer. The reader performs a read operation in which a read potential is imposed across the first and second ferroelectric layers. In the read operation, the second coercive voltage is exceeded across the second ferroelectric layer while the first coercive voltage is not exceeded across the first ferroelectric layer.

DETAILED DESCRIPTION

Figure 1A:
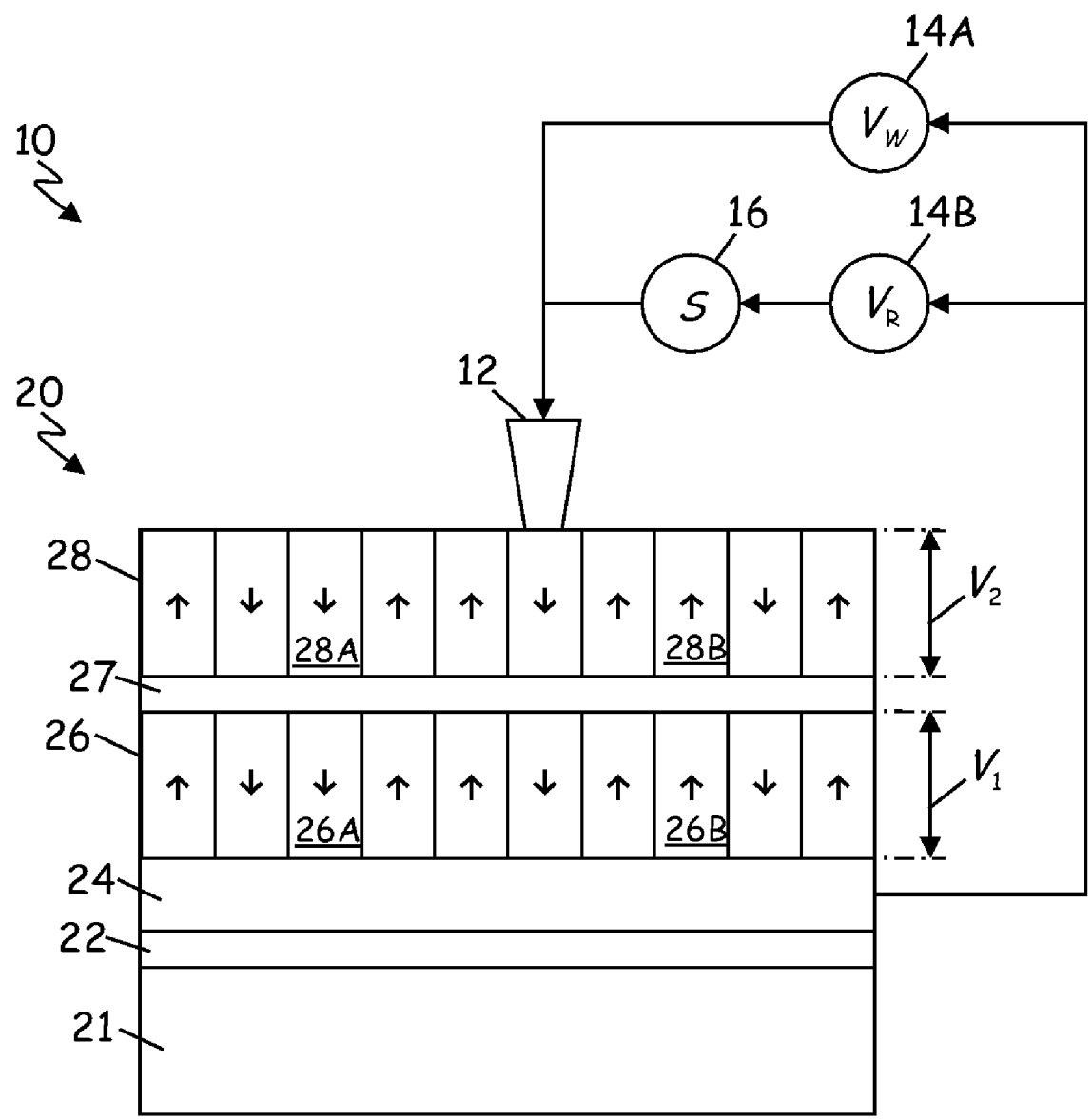
FIG. 1A is a schematic diagram of a multilayer ferroelectric data storage system, according to one aspect of the present invention in an embodiment with ferroelectric coupling.
Figure 1B:
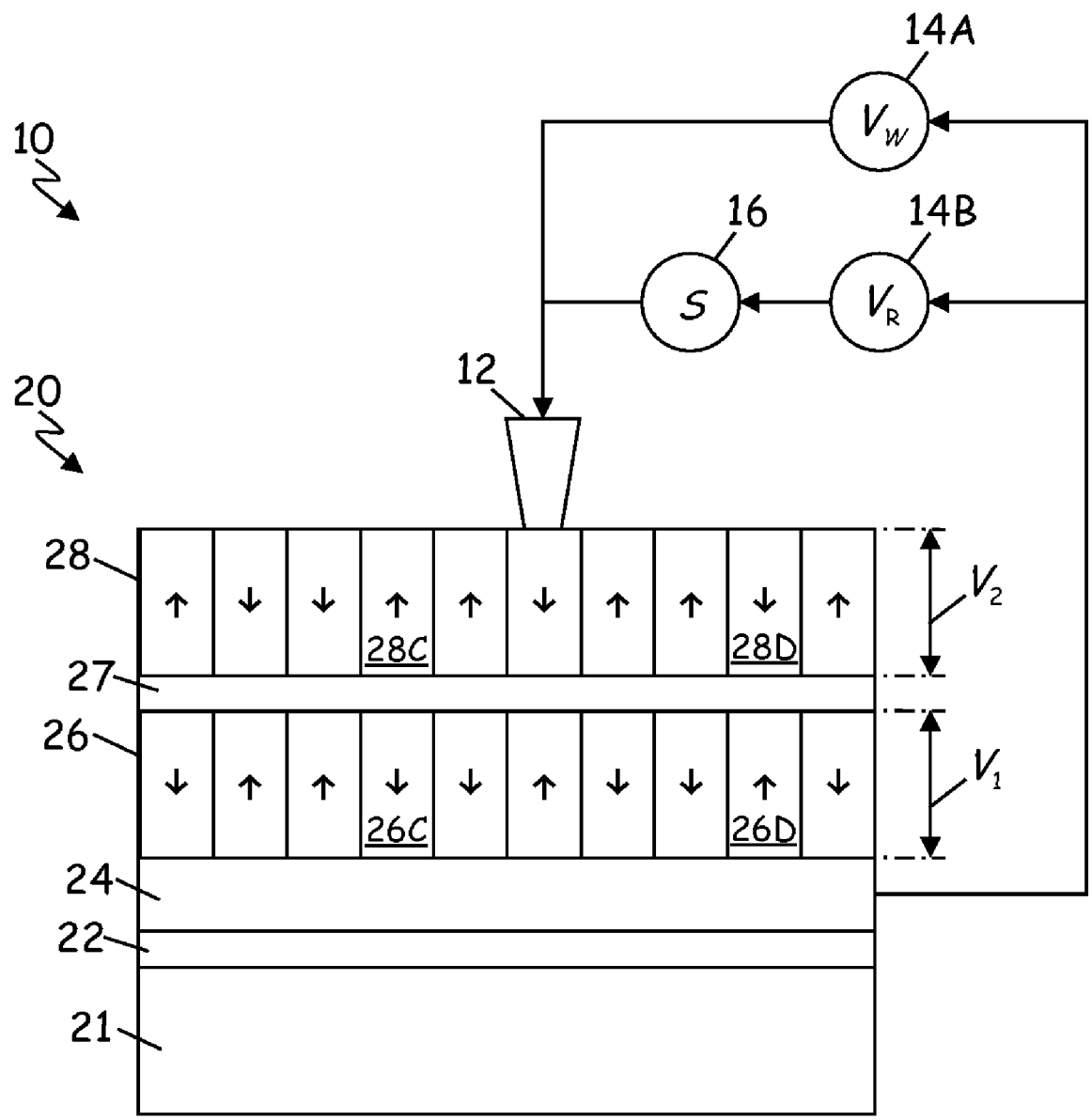
FIG. 1B is a schematic diagram of the ferroelectric data storage system in FIG. 1A, according to one aspect of the present invention in an embodiment with antiferroelectric coupling.

FIGS. 1A and 1B are schematic diagrams of ferroelectric data storage system 10 with multilayer ferroelectric stack 20, in embodiments with ferroelectric and antiferroelectric coupling, respectively. System 10 comprises translating probe 12, voltage sources 14A and 14B, and read sensor 16. In some embodiments voltages sources 14A and 14B comprise distinct components, as shown in FIGS. 1A and 1B, and in other embodiments they comprise one or more shared components (see, e.g., FIG. 3 and FIG. 4, described below).

Multilayer ferroelectric stack 20 comprises substrate 21, buffer/seed layer 22, conducting electrode layer 24, hard (i.e., higher coercive voltage) ferroelectric storage layer 26, spacer layer 27 and soft (i.e., lower coercive voltage) ferroelectric storage layer 28. Probe electrode 12 is positioned above ferroelectric stack 20 in order to perform read and write operations on first (hard) and second (soft) ferroelectric layers 26 and 28. The read operations are regenerative, such that system 10 does not require traditional read/rewrite or refresh operations to recover or restore previously written data, as described below.

Multilayer ferroelectric stack 20 is typically formed as a series of layers or thin films, which are sequentially deposited on substrate 21. Substrate 21 is formed of a base material suitable for thin film deposition in semiconductor and electronics manufacture, such as silicon (Si), gallium arsenide (GaAs), gallium nitrate (GaN), strontium titanate ($SrTiO_3$), lithium aluminate ($LaAlO_3$), dysprosium scandate ($DyScO_3$) or gadolinium scandate ($GdScO_3$).

In some embodiments, seed/buffer layer 22 is formed by depositing an oxide or other suitable material over substrate 21, such as $SrTiO_3$ (STO), $LaAlO_3$ (LAO), $DyScO_3$ (DSO) or $GdScO_3$ (GSO). In these embodiments, the materials and thickness of seed/buffer layer 22 are selected to buffer materials with different physical or chemical properties, or both, or to influence the smoothness or other characteristics of additional layers in multilayer stack 20, such as crystal structure, grain size and orientation, inter-layer interface formation and adhesion. Alternatively, seed/buffer layer 22 is absent and bottom electrode layer 24 is formed directly on substrate 21, rather than on seed/buffer layer 22.

First (bottom) electrode layer 24 forms a conducting path for imposing a potential across storage layers 26 and 28, using probe electrode 12 as described below. In some embodiments, electrode layer 24 is formed of a conducting material such as a conducting metal or metal alloy. In other embodiments, electrode layer 24 is formed of a conducting metal oxide, for instance $SrRuO_3$ (SRO) or $LaSrCoO_3$ (LSCO).

First (bottom) and second (top) storage layers 26 and 28 are formed of ferroelectric materials with particular coercive field strengths, such as $BaTiO_3$ (BTO), $BiFeO_3$ (BFO), $SrBi_2Ta_2O_9$ (SBT) or $(Bi,La)_4Ti_3O_{12}$ (BLT). Alternatively, one or both of storage layers 26 and 28 are formed of an adjustable-coercivity compound in which the coercive field magnitude depends upon relative composition, such as one or more of:

$$PbZr_xTi_{1-x}O_3(PZT), \quad [1]$$

$$(1-y)(PbMg_{1/3}Nb_{2/3}O_3)\text{-}yPbZr_xTi_{1-x}O_3, \quad [2]$$

$$(1-y)(PbMg_{1/3}Nb_{2/3}O_3)\text{-}yPbTiO_3(PMN\text{-}PT), \quad [3]$$

or $$(1-x)(PbZn_{1/3}Nb_{2/3}O_3)\text{-}xPbTiO_3(PZN\text{-}PT). \quad [4]$$

Generally, these ferroelectric materials are deposited in thin films or layers of approximately 10-50 nm in thickness, for instance 30±10 nm thick. When the layers are too thick, however, lateral resolution is reduced, resulting in smaller areal bit density. When the layers are too thin, there are stability issues and leakage effects related to non-insulating defects.

In appropriate thin film geometries, the ferroelectric layers are typically self-poling, such that the domains tend to align perpendicularly or anti-perpendicularly to the layer. In some embodiments, however, a pre-poling step is used to enhance or alter domain orientation, and to increase or decrease ferroelectric response as desired.

Depending upon material composition, dimension, domain alignment and inherent ferroelectric properties, each of ferroelectric layers 26 and 28 has a particular coercive field (alternatively, a coercive voltage or coercive potential). Typically, one of layers 26 and 28 is a hard ferroelectric layer, and one is a soft ferroelectric layer, such that the coercive voltage of the hard layer exceeds (is greater in magnitude than) that of the soft layer, and the coercive voltage of the soft layer is less than (is less in magnitude than) that of the hard layer. As shown in FIG. 1, for example, first (bottom) layer 26 is a hard ferroelectric layer, and second (top) layer 28 is a soft ferroelectric layer. Alternatively, first (bottom) layer 26 is a soft ferroelectric layer, and second (top) layer 28 is a hard ferroelectric layer.

Spacer/interface layer 27 compensates for interface effects between the hard and soft layers, including polar discontinuities at the boundary between different ferroelectric materials. In some embodiments, spacer/interface layer 27 is automatically formed as an interface layer between different ferroelectric layers 26 and 28. In other embodiments, spacer/interface layer 27 is formed of an insulator or dielectric material such as $SiO_2$ (silicon dioxide) or $SrTiO_3$, which spaces first storage layer 26 from second storage layer 28. Alternatively, spacer/interface layer 27 is absent and surface effects are uncompensated along the boundary between ferroelectric storage layers 26 and 28.

System 10 operates as a two-terminal device, in which probe electrode (or top electrode) 12 is positioned above multilayer stack/ferroelectric medium 20, opposite bottom electrode layer 24 across ferroelectric storage layers 26 and 28. Voltage sources 14A and 14B provide write voltage $V_W$ and read voltage $V_R$ to probe electrode 12, as measured with respect to bottom electrode layer 24, in order to perform read and write operations on multilayer ferroelectric stack 20 by imposing first potential $V_1$ across first ferroelectric layer 26 and second potential $V_2$ across second ferroelectric layer 28.

In read operations, read sensor 16 senses the resulting current or voltage signal from probe electrode 12, which is due to polarization switching in one or both of storage layers 26 and 28. Typically, the switching occurs in soft ferroelectric layer 28, and hard ferroelectric layer 26 does not switch during the read operation. In some multi-layer storage systems, however, other switching schemes are sometimes utilized.

In contrast to destructive read-based designs, system 10 performs regenerative read operations or "non-erase" readback. That is, the read process is non-destructive, because read operations only produce switching in soft layer 28, while hard layer 26 retains its existing orientation. Once the read and write potentials are removed, domains in soft ferroelectric layer 28 re-align according to the previously-written bit pattern, due to the coupling with hard ferroelectric layer 26. In the ferroelectric (FE) coupling embodiment of FIG. 1A, for example, domains in soft layer 28 (e.g., soft layer domains 28A and 28B) are aligned in the same direction as corresponding domains in hard layer 26 (e.g., hard layer domains 26A and 26B), where corresponding domains are located directly above and below one another in ferroelectric layers 26 and 28. Alternatively, the coupling is antiferroelectric (AFE), as shown in FIG. 1B, and domains in soft layer 28 are oriented oppositely to corresponding domains in hard layer 26 (e.g., domains 28C and 28D in soft layer 28 are aligned oppositely to domains 26C and 26D in hard layer 26.)

Potentials $V_1$ and $V_2$ depend not only upon the magnitude and direction of externally imposed voltage V, but also on other factors such as the conductivity of electrode layer/conductor 24 and probe 12, the electrical impedance of ferroelectric layers 26 and 28, the dielectric constant and surface charge density of any spacer/interface layer 27, and the electrical effects of other layers in multilayer ferroelectric stack 20 such as seed layer 22 and substrate 21. In order to perform successful regenerative read operations on multilayer ferroelectric stack 20, data storage system 10 must take each of these effects into account.

Figure 2A:
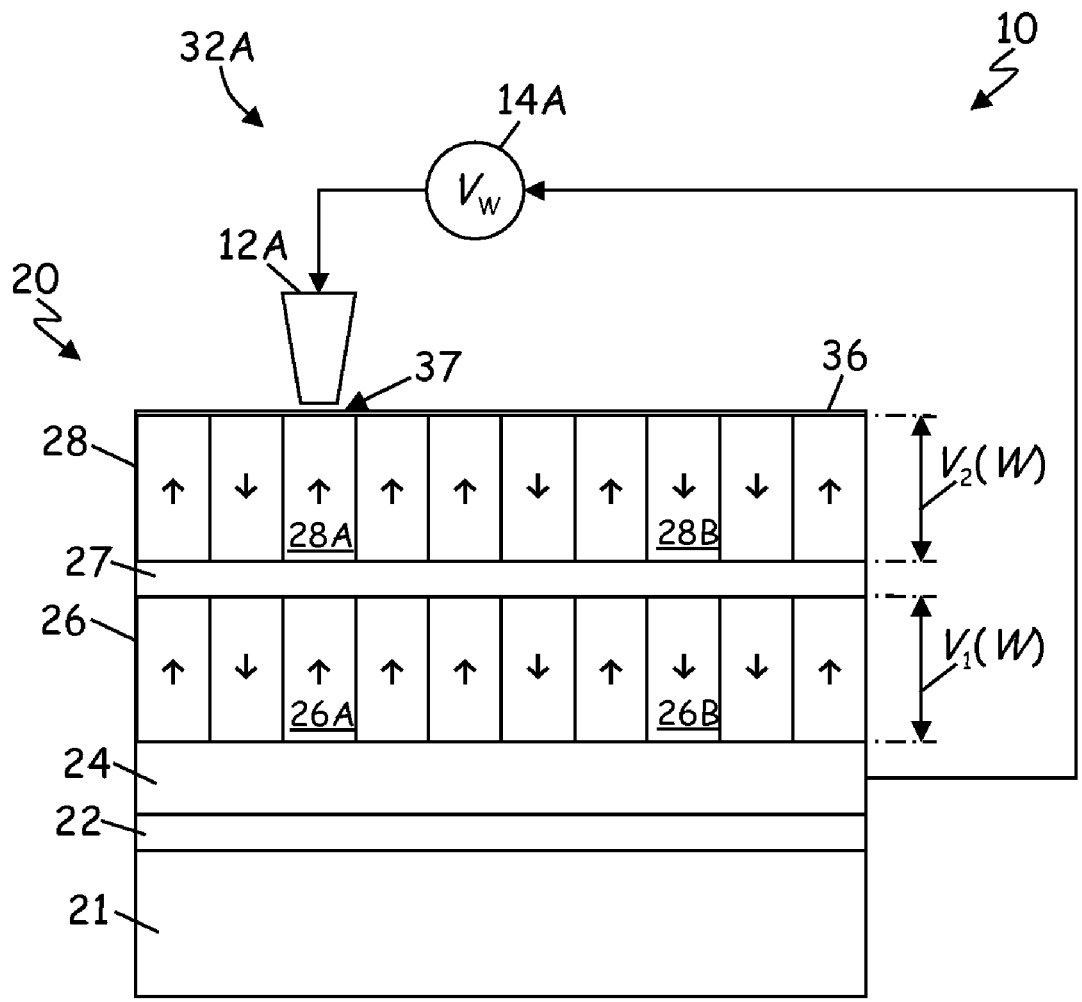
FIG. 2A is a schematic diagram of the ferroelectric data storage system in FIG. 1A, illustrating a write operation according to one aspect of the invention.
Figure 2B:
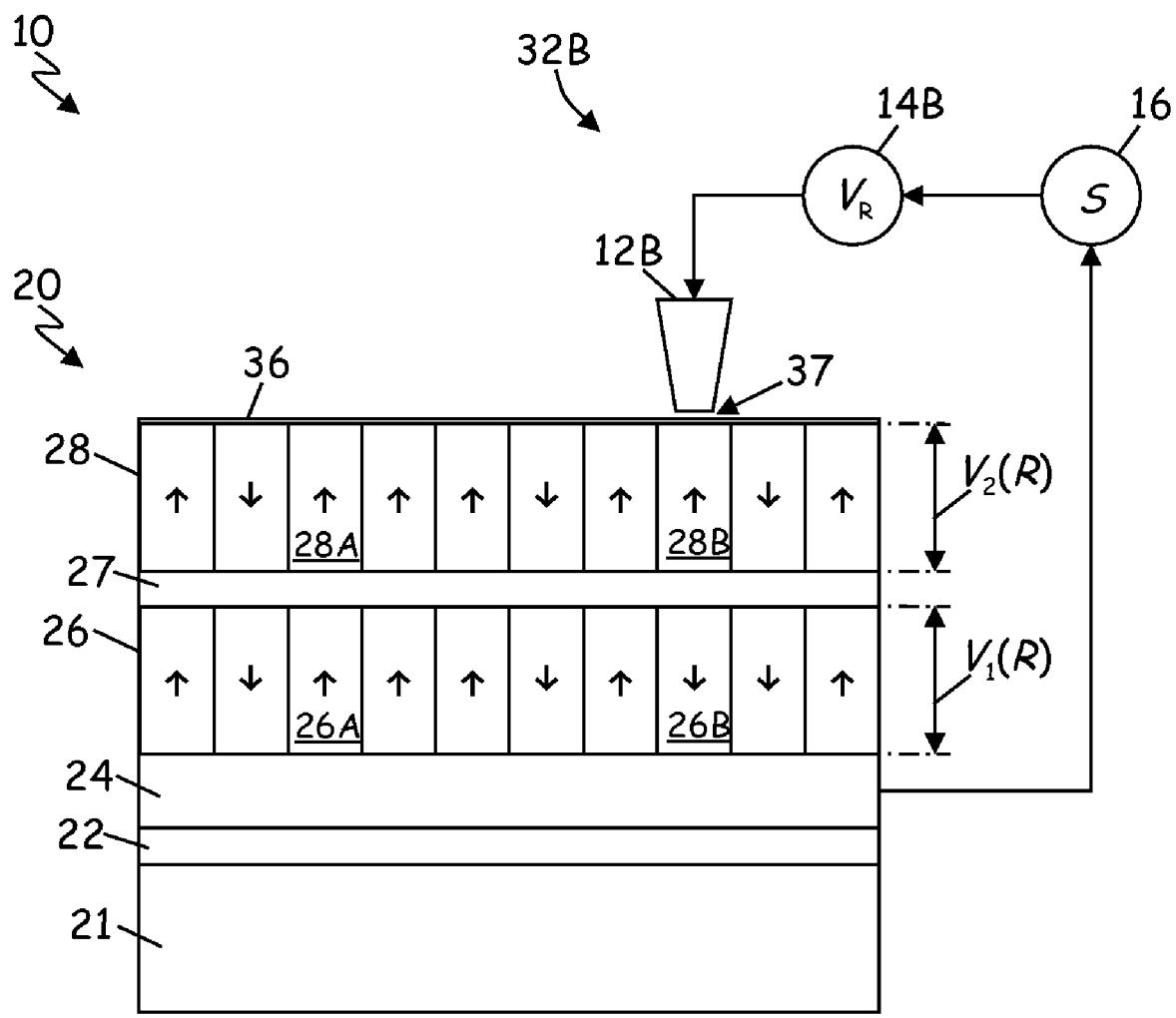
FIG. 2B is a schematic diagram of the ferroelectric data storage system in FIG. 1A, illustrating a read operation according to one aspect of the present invention.

FIGS. 2A and 2B are schematic diagrams of ferroelectric data storage system 10, illustrating write and read operations, respectively, in an embodiment with FE coupling. In some embodiments, top (probe) electrodes 12A, 12B are spaced above ferroelectric stack 20 by protective coating 36, read/write gap (or air gap) 37, or both. In other embodiments, top electrodes 12A, 12B are contact electrodes, and are positioned in contact with ferroelectric stack 20 as shown for transducer probe 12 of FIGS. 1A and 1B.

Write probe 12A and write voltage source 14A are typically incorporated into writer (or write head) 32A, while read probe 12B, read voltage source 14B and read sensor 16 are typically incorporated into reader (or read head) 32B. Alternatively, writer/write voltage source 14A and reader/read voltage source 14B each utilize a single probe such as transducing probe 12 of FIGS. 1A and 1B, or share other components as described above. In these embodiments, writer 32A and reader 32B are sometimes physically or logically associated, or both, and referred to collectively as a transducer.

System 10 performs read and write operations on multilayer ferroelectric stack 20 by positioning writer 32A and reader 32B over desired locations (or bit regions) of hard layer 26 and soft layer 28, opposite bottom electrode 24. In FIG. 2A, for example, writer 32A is positioned above ferroelectric stack 20 to perform a write operation on domains 26A and 28A of hard and soft ferroelectric layers 26 and 28, respectively. In FIG. 2B, reader 32B is positioned above ferroelectric stack 20 to perform a regenerative read operation on domain 28B of soft layer 28, while the polarization in domain 26B of hard layer 26 retains its existing (previously written) orientation.

In continuous media-based embodiments, such as those shown in FIGS. 2A and 2B, writer 32A and reader 32B are typically formed as a transducer or read/write head, for instance on a slider or other thin-film electronic device, which translates relative to multilayer ferroelectric stack/data storage medium 20 via an actuator, rotating disc, x-y scanner, tape drive or other positioning mechanism. Alternatively, writer 32A and reader 32B utilize a fixed electrode structure as part of an addressable storage array, as described below with respect to FIG. 3 and FIG. 4.

In write operations of system 10, writer 32A exerts write potential $V_W$ across write probe (electrode) 12A and bottom electrode 24, as shown in FIG. 2A, such that first potential $V_1(W)$ exceeds the coercive voltage across hard ferroelectric storage layer 26 and second potential $V_2(W)$ exceeds the coercive voltage across soft ferroelectric storage layer 28, such that polarizations within domain 28A of soft layer 28 and domain 26A of hard layer 26 are oriented according to the direction of write potential $V_W$. In the case of AFE coupling, potentials $V_1(W)$ and $V_2(W)$ are also sufficient in magnitude to break the AFE coupling between soft layer 28 and hard layer 26, in order to produce the desired alignment.

As writer 32A translates along ferroelectric medium/multilayer stack 20, a bit pattern is recorded as a series of alternating polarizations in hard and soft layers 26 and 28. As shown in FIG. 2A, for example, the write potential is positive, in the sense that polarizations within domains 26A and 28A are each oriented in an upwards direction. Alternatively, the write potential is negative and the polarizations are oriented in a downward direction, as shown for domains 26B and 28B. After the write potential is removed, hard layer 26 remains aligned in the direction defined by the write potential, and soft layer 28 either aligns or anti-aligns with hard layer 26 depending upon whether the coupling is FE or AFE.

In read operations of system 10, reader 32B imposes read potential $V_R$ across read probe (electrode) 12B and electrode layer 24, as shown in FIG. 2B, such that first potential $V_1(R)$ is less than the coercive voltage across hard ferroelectric layer 26, while second potential $V_2(R)$ exceeds the coercive voltage across soft ferroelectric layer 28. Potential $V_2(R)$ is also sufficient to break the Fe or AFE coupling between soft layer 28 and hard layer 26, such that polarization within domain 28B of soft layer 28 is oriented according read potential $V_R$, while polarization within domain 26B of hard layer 26 retains its existing orientation, as determined in a previous write operation.

When the existing polarization in soft layer 28 has polarity opposite to read potential $V_R$, the polarization re-aligns or switches, for example from an existing negative or down orientation to a positive or upwards orientation, as shown for soft layer domain 28B, which corresponds to a positive or upwards orientation for read potential $V_R$. In some embodiments, the signal in sensor 16 is a current signal based on a flow of compensation charge that is induced by polarization switching within soft layer 28. In other embodiments, the signal is a transient or differential voltage or current signal, as associated either with compensation charges or another related effect of polarization switching.

Polarization switching generates a particular readback or "switching" signal in sensor 16, which in turn indicates a particular binary bit value (for example, "1"). When the existing polarization in soft layer 28 already has the same polarity as read potential $V_R$, on the other hand (as shown for soft layer domain 28A), there is no polarization switching and the readback signal in sensor 16 is a "non-switching" signal, or is absent. This corresponds to a complementary bit value (that is, "0"). Alternatively, the bit definitions are reversed, such that "0" and "1" correspond to switching and non-switching signals, respectively, rather than non-switching and switching signals.

During non-regenerative read operations, memory of the bit orientation in soft layer 28 is lost because the soft layer domains (for example, domains 28A and 28B) are oriented according to read potential $V_R$, regardless of original polarization (that is, regardless of the originally written bit orientation). In previous designs this results in a destructive read process, because each domain is mapped according to the read potential, and the original bit pattern in soft layer 28 is erased.

In system 10, however, bit values are also stored in hard layer 26 (for example, in hard layer domains 26A and 26B). This provides for regenerative read operations, in which the original bit pattern is not destroyed or erased. That is, after read potential $V_R$ is removed (for example, by moving probe electrode 12B or adjusting the voltage source), soft layer domains 28A and 28B re-align in the originally written direction, due to the coupling with corresponding hard layer domains 26A and 26B.

Regenerative read processes increase operational speed and response, reduce power requirements and decrease the risk of data loss due to failed refresh or rewrite cycles. In typical embodiments, and in contrast to other ferroelectric-based storage technologies, multilayer ferroelectric stack 20 spontaneously returns to its original state after each read operation, and does not require active refresh or rewrite operations to recover or restore the previously written data.

The realignment process is somewhat complex, and depends upon coupling mechanism. In general, interlayer FE coupling is described by thermodynamics, with AFE coupling based on Landau theory or the transverse Ising Model. In addition, some films are formed with a composition gradient that produces a built-in potential due to the composition-induced polarization gradient, where the built-in potential stabilizes or destabilizes coupling depending upon the orientation of the built-in potential with respect to the depolarizing fields. Based on the coupling strength between advanced ferroelectric material compositions in storage layers 26 and 28, as described above, both FE and AFE domain orientations are stable for a period of at least years, and up to twenty years, without the need for a refreshing current or rewrite/restore cycle.

In embodiments with ferroelectric (FE) coupling, soft layer domains 28A and 28B tend to align in the same direction as corresponding hard layer domains 26A and 26B, as shown, for example, in FIG. 1A. Typically the bias field in soft layer 28 due to the polarization of hard layer 26 is sufficient to exceed the coercive voltage across soft layer 28, such that domain re-alignment is spontaneous.

Alternatively the coupling strength is insufficient, or residual field effects are present such that a small recoupling signal is required. A recoupling signal reverses the bias of read potential $V_R$, and has sufficient magnitude (in combination with the bias field from hard layer 26), to reorient "stuck" bit domains in soft layer 28 to the proper (coupled) orientation. At the same time, the recoupling signal is sufficiently small to prevent erasure; in particular, externally imposed potential $V_1$ is less than the coercive voltage across soft ferroelectric layer 28, such that properly oriented bits are not realigned.

That is, the recoupling signal magnitude and direction are selected such that realignment occurs only when domains in soft layer 28 are not properly oriented with respect to the bias field from hard layer 26, and realignment does not occur when domains in soft layer 28 are properly oriented with respect to the bias field from hard layer 26. For antiferroelectric (AFE) coupling, as shown in FIG. 1B, domains in soft layer 28 tend to align oppositely to the corresponding domains in hard layer 26. In these embodiments, bits are sometimes "stuck" (uncoupled) after both read and write operations, and one or both sometimes require a recoupling signal to restore the proper AFE (anti-parallel) orientation.

Figure 3:
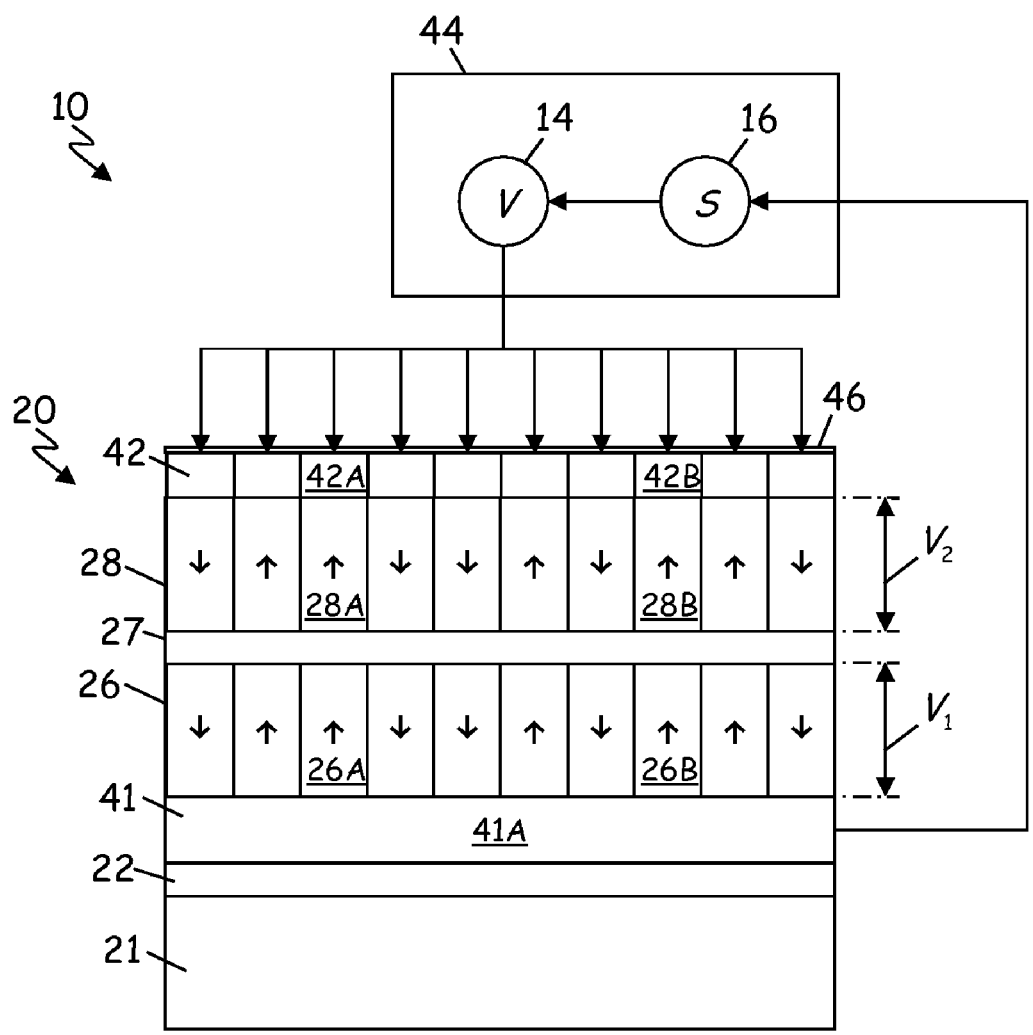
FIG. 3 is a schematic diagram of the ferroelectric data storage system in FIG. 1A, according to one aspect of the present invention in a storage-cell based embodiment with addressable electrode arrays.

FIG. 3 is a schematic diagram of ferroelectric data storage 10, in a storage-cell based embodiment with addressable electrode arrays 41 and 42. In this embodiment, the writer and reader are comprised in solid state read/write circuitry 44, which includes, but is not limited to, voltage source 14, read sensor 16 and one or more address modules for addressing top electrode array 42 and bottom electrode array 41 by switching the lines going to individual elements, such as elements 42A and 42B.

In contrast to the continuous-media-based embodiments of FIGS. 1A, 1B, 2A and 2B, above, which utilize a translating probe electrode configuration, in storage-cell embodiments both the bottom and top electrodes are fixed with respect ferroelectric stack 20. In particular, bottom and top electrode layers 41 and 42 are fixed with respect to first and second ferroelectric layers 26 and 28, such that first (hard) storage layer 26 and second (soft) storage layer 28 are oriented generally parallel to and in between top and bottom electrode layers 41 and 42. In this particular embodiment, hard and soft storage layers 26 and 28 are also separated by spacer/interface layer 27, and top electrode layer 42 is provided with external protective layer 46, to protect from moisture, reactive agents and electrical or physical contact.

Addressable electrode layers 41 and 42 are formed as a number of conducting elements such as strips or linear pad arrays, where the elements of bottom electrode layer 41, such as bottom strip 41A, are oriented transversely or orthogonally to the elements of top electrode layer 42, such as top strips 42A and 42B. Addressable electrode layers 41 and 42 thus divide multilayer ferroelectric stack 20 into a two-dimensional array of individual memory cells, which are addressed, for example, via a switching trace network that selects particular addressable element pairs that intersect above and below the desired cell locations. Read/write circuitry 44 selects (or switches) the appropriate pairs for read and write operations using RAM (random-access memory), ROM (read-only memory) and EPROM-type addressing components, or analogous means.

To perform read or write functions on the cell containing hard and soft layer domains 26A and 28A, for example, read/write circuitry 44 addresses (switches) bottom strip 41A of bottom electrode layer 41, which passes underneath the desired cell location, and top strip 42A of top electrode layer 42, which intersects with bottom strip 41A above the desired cell location. Voltage source 14 then applies appropriate voltages $V_1$ and $V_2$ across hard and soft ferroelectric layers 26 and 28, respectively, and read sensor 16 is used to decode the bit pattern as described above.

As with translating probe embodiments, the addressable data storage array of FIG. 3 distinguishes from three-terminal and transistor-based technologies, in which each memory cell is provided with a source electrode, a drain electrode and a base electrode. Instead, system 10 utilizes a two-terminal top and bottom electrode configuration, in which top and bottom electrode layers 41 and 42 comprise a number of conducting strips or other addressable components for selecting particular memory cell locations within multilayer ferroelectric stack 20.

Fixed electrode layers 41 and 42 function as addressable transducers for imposing external voltages across ferroelectric layers 26 and 28, via voltage source 14, and for sensing switching signals as a function of compensation charges or other polarization switching effects in soft ferroelectric layer 28, via read sensor 16. In particular, the readback signal in sensor 16 is based on compensation charge effects due to perpendicular polarization switching in soft ferroelectric storage layer 28, while the polarization in hard ferroelectric storage layer 26 remains fixed in an existing orientation.

In addressable memory array (or solid state) embodiments, system 10 does not require an electrode positioning mechanism such as a slider actuator, or a disc or tape drive. This increases response and startup/shutdown time, and decreases mechanical power requirements. In solid state embodiments, ferroelectric data storage system 10 is adaptable to a wide range of computational-based data processing environments, including non-volatile memory for digital data processors and other computing applications.

Figure 4:
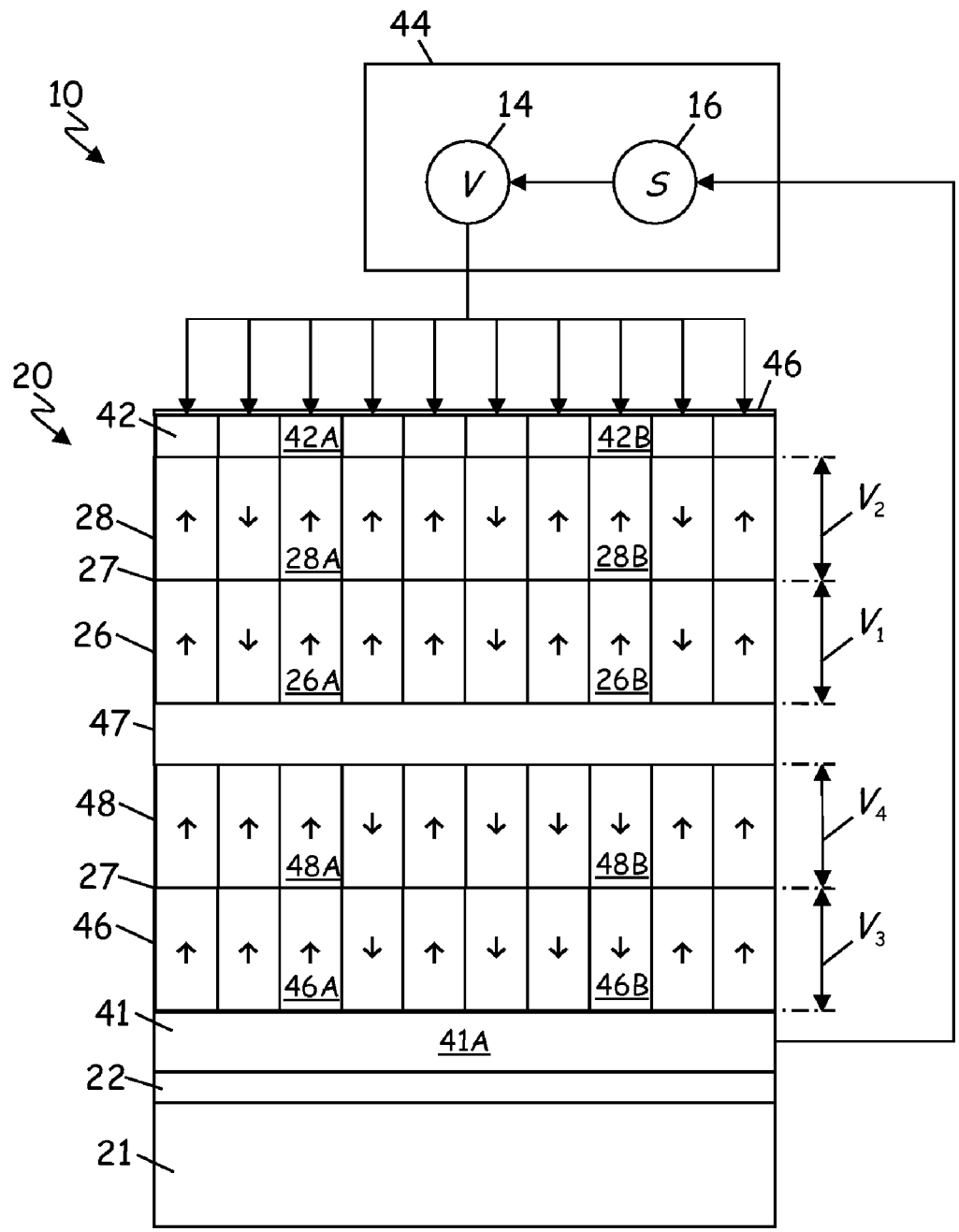
FIG. 4 is a schematic diagram of the ferroelectric data storage system in FIG. 3, according to one aspect of the present invention in an embodiment with multiple independent storage layers.

FIG. 4 is a schematic diagram of ferroelectric data storage system 10 with multilayer ferroelectric stack 20 having hard and soft storage layers 26 and 28, as described above, and independent hard and soft storage layers 46 and 48. In the particular storage cell-based embodiment of FIG. 4, each of storage layers 26, 28, 46 and 48 is stacked in a parallel fashion between bottom and top addressable electrode layers 41 and 42. Alternatively, a translating probe arrangement is used, as described above, and stack 20 forms a continuous multilayer medium.

First hard and soft storage layers 26 and 28 are separated from second hard and soft storage layers 46 and 48 by interlayer spacer 47, and the coupling between first soft storage layer 28 and first hard storage layer 26 is independent of the coupling between second soft storage layer 48 and second hard storage layer 46. Spacer/interface layers 27 are formed between storage layers 26/28 and storage layers 46/48, either as an interface (as shown in FIG. 4) or with spacer layer materials (see. e.g., FIGS. 1A and 1B, illustrating both FE and AFE embodiments).

To perform read and write operations on multiple independent storage layers, system 10 utilizes read/write circuitry 44 to select a particular memory cell within multilayer ferroelectric stack 20 via addressable electrode layers 41 and 42, or employs a translating read/write head to select a bit region as described above. In contrast to single-bit designs, however, in the embodiment of FIG. 4 system 10 selects a multiple-bit memory cell or media region, and potential V is applied such that first potential $V_1$ is imposed across first hard ferroelectric layer 26, second potential $V_2$ is imposed across first soft ferroelectric layer 28, third potential $V_3$ is imposed across second hard ferroelectric layer 46, and fourth potential $V_4$ is imposed across second soft ferroelectric layer 48.

First hard storage layer 26, second hard storage layer 46, first soft storage layer 28 and second soft storage layer 48 each have independently defined coercive voltages. In particular, first soft storage layer 28 is typically a soft ferroelectric layer with respect to first hard storage layer 26, and these layers coupled independently of second hard and soft layers 46 and 48. Similarly, second soft storage layer 48 is typically a soft ferroelectric layer with respect to second hard storage layer 46, and these layers are coupled independently of first hard and soft layers 26 and 28.

System 10 decouples data storage operations for multiple independent hard/soft storage layer pairs by selecting appropriate read/write potentials and coercive voltages. In one embodiment, for example, second hard ferroelectric storage layer 46 has a coercive voltage lower than first hard ferroelectric storage layer 26, but higher than first soft storage layer 28, while second soft ferroelectric storage layer 48 has a coercive voltage lower than second hard storage layer 46, and lower than first hard storage layer 26 and first soft storage layer 28. This allows system 10 to perform independent write operations on first and second hard storage layers 26 and 46, and to perform independent regenerative read operations on first and second soft storage layers 28 and 48.

In one such example a two-stage independent write cycle is used. In this example, external potential V is initially selected or imposed as a first write potential across the top and bottom electrodes, such that potentials $V_1$-$V_4$ exceed (are greater in magnitude than) the coercive voltages across each of ferroelectric layers 26, 28, 46 and 48, respectively. As a result, all the domains are aligned according to the write potential, as shown for domains 26A, 28A, 46A and 48A. Then, external potential V is imposed as a second write potential, such that potentials $V_3$ and $V_4$ exceed the respective coercive voltages across second hard storage layer 46 and second soft storage layer 48, while potential $V_1$ does not exceed (is equal or less in magnitude than) the coercive voltage across first hard storage layer 26.

As a result of the second write step, polarizations in second hard storage layer 46 and second soft storage layer 48 are aligned according to the second write potential, while the polarization in first hard storage layer 26 retains its existing (previously written) orientation, according to the first write potential. Typically, first soft storage layer 28 also orients according to the second write potential, because potential $V_2$ typically exceeds the corresponding first soft layer coercive voltage, but when the write potentials are removed first soft storage layer 28 recouples to first hard storage layer 26, independently of second hard storage layer 46. The resulting independent bit orientations (or polarizations) are shown for domains 26B, 28B, 46B and 48B. This allows system 10 to write individual and independently defined bit patterns to two or more storage layer pairs within multilayer ferroelectric stack 20.

In an example of a two-step independent regenerative read operation, external potential V is initially imposed as a first read potential, such that potential $V_4$ exceeds the coercive voltage across second soft storage layer 48, while potentials $V_1$-$V_3$ do not exceed the coercive voltages across first hard storage layer 26, first soft storage layer 28 and second hard storage layer 46, respectively. This allows current sensor 16 to detect a switching signal from second soft storage layer 48, independently of first soft storage layer 28 (for example, according to the bit value stored in second soft layer domain 48B, which is different from the bit value stored in first soft layer domain 26B).

Next, external potential V is imposed as a second read potential, such that potentials $V_2$ and $V_4$ exceed the coercive voltages across first and second soft storage layers 28 and 48, respectively, while potentials $V_1$ and $V_3$ do not exceed the coercive voltages across first and second hard storage layers 26 and 46. This allows current sensor 16 to detect a switching signal from first soft storage layer 28, independently of second soft storage layer 48, because the second soft layer polarization is already aligned according the direction of the second read potential, by virtue of the first read step. When the read voltages are removed, the soft layer domains independently re-align according to the corresponding hard layer domains, so the read process is both independent and regenerative (non-destructive), and does not require a read/rewrite or refreshing step. In some embodiments, however, a recoupling signal is required, as described above.

The multiple-layer embodiment of FIG. 4 increases areal storage density and improves response time because there is no need to move the translating probe (for media embodiments) or re-address the data cell (for data storage array embodiments) between successive operations on "stacked" bits. While FIG. 4 is shown with two independent pairs of hard/soft storage layers 26/28 and 46/48, moreover, in other embodiments additional layers are added, allowing system 10 to read and write multiple stacked bits in each data cell, or to read and write multiple stacked bits at different depths of a continuous multilayer ferroelectric medium.

In addition, the particular coercive voltages and independent read/write steps described herein are merely illustrative. In other embodiments, for example, second hard/soft layer pair 46/48 is formed with relatively higher coercive voltages than first hard/soft layer pair 26/28, such that read/write operations on storage layers 26 and 28 are performed at relatively lower potential, and read/write operations on storage layers 46 and 48 (and any other additional layers) are performed at relatively higher potential. Alternatively, some embodiments use additional addressing layers 41 and 42, for example in between storage layers 26/28 and 46/48, in order to individually address individual data storage layers, or individual groups of data storage layers, and further decouple the read and write operations.

The present invention has been described with reference to preferred embodiments, but the terminology used is for the purposes of description, not limitation. Workers skilled in the art will recognize that changes may be made in form and detail without departing from the spirit and scope of the invention. The implementations described above and other implementations are within the scope of the following claims.

The invention claimed is:

1. A system comprising:
a first storage layer having a first coercive potential and a first polarization;
a second storage layer having a second coercive potential that is less than the first coercive potential and a second polarization that is coupled to the first polarization;
a writer for performing a write operation in which a write potential is imposed across the first and second storage layers, such that the first coercive potential is exceeded across the first storage layer and the second coercive potential is exceeded across the second storage layer; and a reader for performing a read operation in which a read potential is imposed across the first and second storage layers, such that the second coercive potential is exceeded across the second storage layer and the first coercive potential is not exceeded across the first storage layer.

2. The system of claim 1, wherein the second storage layer is ferroelectrically coupled to the first storage layer.

3. The system of claim 1, wherein the second storage layer is antiferroelectrically coupled to the first storage layer.

4. The system of claim 1, wherein the reader further senses the second polarization as a function of a switching signal based on a compensation charge flow that is induced when the second polarization is aligned according to the read potential, independently of the first polarization.

5. The system of claim 1, further comprising a substrate formed under the conducting layer.

6. The system of claim 5, further comprising a dielectric spacer formed between the first storage layer and the second storage layer.

7. The system of claim 1, wherein each of the reader and the writer is a two-terminal device comprising a bottom electrode and a top electrode.

8. The system of claim 7, further comprising a translating probe electrode for selecting a bit region within the first and second storage layers.

9. The system of claim 7, further comprising an addressable electrode layer for selecting a memory cell within the first and second storage layers.

10. The system of claim 1, further comprising:
a third storage layer having a third coercive potential that is greater than the second coercive potential and different from the first coercive potential; and
a fourth storage layer having a fourth coercive potential that is less than the third coercive potential and different from the second coercive potential;
wherein the third storage layer has a third polarization and the fourth storage layer has a fourth polarization that is coupled to the third polarization, independently of the first and second polarizations.

11. A method of reading and writing data, the method comprising:
writing data to first and second ferroelectric layers by imposing a write voltage across the first and second ferroelectric layers such that a first coercive voltage is exceeded across the first ferroelectric layer and a second coercive voltage is exceeded across the second ferroelectric layer; and
reading data from the second ferroelectric layer by imposing a read voltage across the first and second ferroelectric layers such that the second coercive voltage is exceeded across the second ferroelectric layer while the first coercive voltage is not exceeded across the first ferroelectric layer.

12. The method of claim 11, wherein reading data from the second ferroelectric layer comprises sensing a signal based on a compensation charge flow that is induced by polarization switching in the second ferroelectric layer.

13. The method of claim 11, further comprising positioning a translating read/write probe over the first and second ferroelectric layers.

14. The method of claim 11, further comprising addressing a memory cell region of the first and second ferroelectric layers.

15. The method of claim 11, further comprising writing data to third and fourth ferroelectric layers by imposing a second write voltage across the first, second, third and fourth ferroelectric layers such that a third coercive voltage is exceeded across the third ferroelectric layer and a fourth coercive voltage is exceeded across the fourth ferroelectric layer, while the first coercive voltage is not exceeded across the first ferroelectric layer.

16. The method of claim 15, further comprising reading data from the fourth ferroelectric layer by imposing a second read voltage across the first, second, third and fourth ferroelectric layers such that the fourth coercive voltage is exceeded across the fourth ferroelectric layer, while the first coercive voltage is not exceeded across the first ferroelectric layer, the second coercive voltage is not exceeded across the second ferroelectric layer and the third coercive voltage is not exceeded across the third ferroelectric layer.

17. A system comprising:
a hard ferroelectric layer having a hard layer polarization and a hard layer coercive potential;
a soft ferroelectric layer having a soft layer polarization coupled to the hard layer polarization and a soft layer coercive potential that is less than the hard layer coercive potential;
a writer for imposing a write potential across the hard and soft ferroelectric layers such that the hard layer polarization and the soft layer polarization are aligned according to the write potential; and
a reader for imposing a read potential across the hard and soft ferroelectric layers such that the soft layer polarization is aligned according to the read potential while the hard layer polarization retains an existing orientation, and for sensing a readback signal based on switching of the soft layer polarization.

18. The system of claim 17, wherein the hard and soft ferroelectric layers are ferroelectrically coupled.

19. The system of claim 17, wherein the hard and soft ferroelectric layers are antiferroelectrically coupled.

20. The system of claim 17, further comprising means for translating the reader and the writer above the hard and soft ferroelectric layers in order to select a bit region for the reader and the writer.

21. The system of claim 17, further comprising means for addressing the hard and soft ferroelectric layers in order to select a memory cell for the reader and the writer.

22. The system of claim 17, wherein the hard ferroelectric layer is a first hard ferroelectric layer having a first hard layer coercive potential, the soft ferroelectric layer is a first soft ferroelectric layer having a first soft layer coercive potential, and further comprising:
a second hard ferroelectric layer having a second hard layer polarization and a second hard layer coercive potential that is greater than the first soft layer coercive potential and less than the first hard layer coercive potential; and
a second soft ferroelectric layer having a second soft layer polarization coupled to the second hard layer polarization, independently of the first hard layer polarization, and having a second soft layer coercive potential that is less than the first soft layer coercive potential.

23. The system of claim 22, wherein the write potential is a first write potential and the writer is further for imposing a second write potential across the first and second hard ferroelectric layers and the first and second soft ferroelectric layers, such that the second hard layer polarization and the second soft layer polarization are aligned according to the second write potential, independently of the first hard layer.

24. The system of claim 22, wherein the read potential is a first read potential and the readback signal is a first readback signal, and wherein the reader is further for imposing a second read potential across the first and second hard ferroelectric layers and the first and second soft ferroelectric layers, such that the second soft layer polarization is aligned according to the second read potential while the second hard layer polarization retains an existing orientation, and wherein the reader further senses a second readback signal based on switching of the second soft layer polarization, independently of the first soft layer.

* * * * *